(12) United States Patent
Bag et al.

(10) Patent No.: US 10,910,439 B1
(45) Date of Patent: Feb. 2, 2021

(54) EFFICIENT INTERCONNECTING LAYER FOR TANDEM SOLAR CELLS

(71) Applicant: Government of the United States as Represented by the Secretary of the Air Force, Wright-Patterson, OH (US)

(72) Inventors: Santanu Bag, Beavercreek, OH (US); Romesh J. Patel, Beaverton, OR (US); Michael F Durstock, West Chester, OH (US); Benjamin J. Leever, Kettering, OH (US)

(*) Notice: Subject to any disclaimer, the term of this patent is extended or adjusted under 35 U.S.C. 154(b) by 0 days.

(21) Appl. No.: 15/719,617

(22) Filed: Sep. 29, 2017

Related U.S. Application Data

(60) Provisional application No. 62/437,289, filed on Dec. 21, 2016.

(51) Int. Cl.
*H01L 27/30* (2006.01)
*H01L 51/42* (2006.01)
(Continued)

(52) U.S. Cl.
CPC ........ *H01L 27/302* (2013.01); *H01L 51/0003* (2013.01); *H01L 51/0021* (2013.01); *H01L 51/0035* (2013.01); *H01L 51/0036* (2013.01); *H01L 51/0043* (2013.01); *H01L 51/0047* (2013.01); *H01L 51/4253* (2013.01); *H01L 51/442* (2013.01)

(58) Field of Classification Search
None
See application file for complete search history.

(56) References Cited

U.S. PATENT DOCUMENTS

| | | | |
|---|---|---|---|
| 2006/0278890 A1 | 12/2006 | Brabec et al. | |
| 2007/0046189 A1* | 3/2007 | Hatwar | H01L 51/5052 313/506 |

(Continued)

FOREIGN PATENT DOCUMENTS

| | | |
|---|---|---|
| WO | WO2013171549 | 11/2013 |
| WO | WO2014144028 | 9/2014 |

OTHER PUBLICATIONS

S. Bag, et al., "Tandem solar cells from accessible low band-gap polymers using an efficient interconnecting layer", ACS Applied Materials & Interfaces 8, p. 16-19 (Year: 2015).*

(Continued)

*Primary Examiner* — Eric R Smith
(74) *Attorney, Agent, or Firm* — Afmclo/Jaz; Timothy M. Barlow

(57) ABSTRACT

A tandem solar cell comprises a back subcell; a front subcell; and an interconnecting layer of Cr/MoO3 between the back subcell and the front subcell and connecting the two subcells in series. The front subcell may comprise a carbazole-thienyl-benzothiadiazole based polymer and the back subcell may comprise an isoindigo-based polymer. A method for making a tandem solar cell comprises a) providing a substrate layer; b) applying a layer of PCDTBT:PC$_{71}$BM to the substrate layer; c) applying a bilayer of chromium and MoO$_3$ to the PCDTBT:PC$_{71}$BM layer; d) applying a layer of P(T3-iI)-2:PC$_{71}$BM on the bilayer of chromium and MoO$_3$; and e) applying a Ca and Al electrode layer on the top.

12 Claims, 6 Drawing Sheets

(51) Int. Cl.
*H01L 51/44* (2006.01)
*H01L 51/00* (2006.01)

(56) References Cited

U.S. PATENT DOCUMENTS

| | | | |
|---|---|---|---|
| 2008/0078437 A1 | 4/2008 | Hammond | |
| 2008/0142814 A1* | 6/2008 | Chu | H01L 33/20 257/79 |
| 2008/0248313 A1 | 10/2008 | Seshadri et al. | |
| 2010/0084011 A1 | 4/2010 | Forrest et al. | |
| 2014/0020739 A1* | 1/2014 | Yang | H01L 27/302 136/255 |
| 2014/0225091 A1* | 8/2014 | O'Carroll | H01L 51/441 257/40 |
| 2015/0105520 A1* | 4/2015 | Bao | C08G 61/126 525/274 |
| 2015/0114467 A1* | 4/2015 | Su | C08G 61/124 136/263 |
| 2015/0179947 A1* | 6/2015 | Dautel | H01L 51/4253 136/263 |
| 2015/0364709 A1* | 12/2015 | Winkel | H01L 51/448 136/251 |
| 2016/0005795 A1* | 1/2016 | Yang | H01L 51/4253 136/255 |

OTHER PUBLICATIONS

C. Grand, et al., "Structure-property relationships directing transport and charge separation in isoindigo polymers", Macromolecules 49, p. 4008-4022 (Year: 2016).*

S. Bag, et al., "Supporting Information: Tandem solar cells from accessible low band-gap polymers using an efficient interconnecting layer", ACS Applied Materials & Interfaces (Year: 2015).*

Z. Zheng, et al., "Highly efficient tandem polymer solar cells with a photovoltaic response in the visible light range", Advanced Materials 27, p. 1189-1194 (Year: 2015).*

J. Liu, et al., "High-efficiency inverted tandem polymer solar cells with step-Al-doped MoO3 interconnection layer, Solar Energy Materials & Solar Cells" 120, p. 744-750. (Year: 2014).*

Z. Zheng et al., "Supporting information for Adv. Mater., DOI:10. 1002/adma." (Year: 2015).*

Po, From lab to fab: how must the polymer solar cell materials design change?—an industrial perspective, Energy Environ. Sci., 2014, 7, 925.

Kim JK, Efficient Tandem Polymer Solar Cells Fabricated by All-Solution Processing, Science vol. 317, 2007, 222-225.

You, J., 10.2% Power Conversion Efficiency Polymer Tandem Solar Cells Consisting of Two Identical Sub-Cells, Adv. Mater. 2013, 25, 3973-3978.

Huo, L., Single-Junction Organic Solar Cells Based on a Novel Wide-Bandgap Polymer with Efficiency of 9.7, Adv. Mater. 2015, 27, 2938-2944.

You, J., A polymer tandem solar cell with 10.6% power conversion efficiency, Nature Communications, 4,1446, DOI: 10,1038.

Chen, CC, An Efficient Triple-Junction Polymer Solar Cell Having a Power Conversion Efficiency Exceeding 11, Adv. Mater. 2014, 26, 5670-5677.

Zhou, H., Polymer Homo-Tandem Solar Cells with Best Efficiency of 11.3, Adv. Mater. 2015, 27, 1767-1773.

* cited by examiner

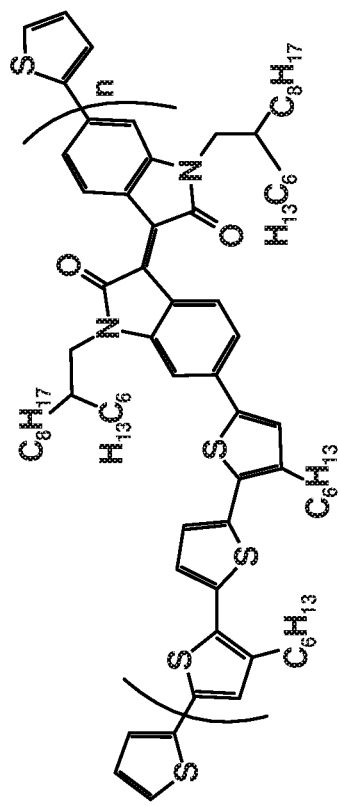
FIG. 1A
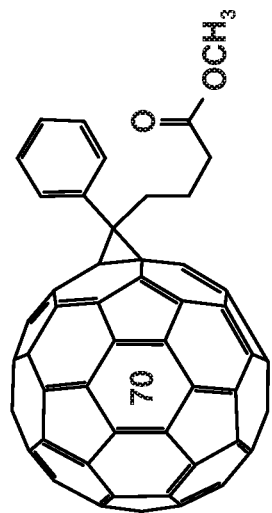
FIG. 1B
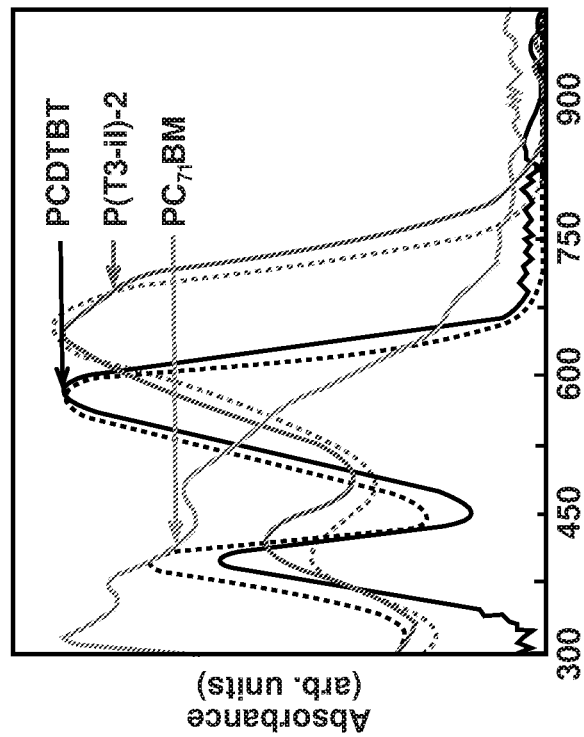
FIG. 1C
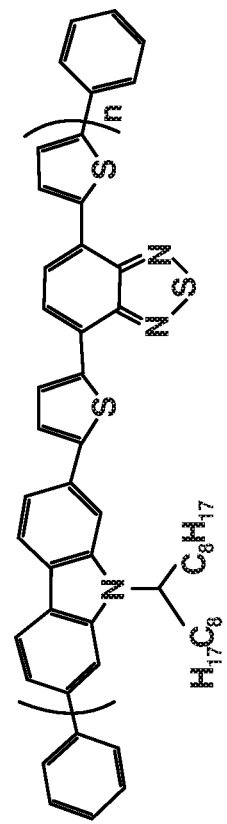

EFFICIENT INTERCONNECTING LAYER FOR TANDEM SOLAR CELLS

PRIORITY

Pursuant to 37 C.F.R. § 1.78(a)(4), this application claims the benefit of and priority to prior filed Provisional Application Ser. No. 62/437,289, filed Dec. 21, 2016, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to solar cell construction and, more particularly, to an efficient interconnecting layer for tandem solar cells.

BACKGROUND OF THE INVENTION

Solution-processed polymer solar cells (PSCs) are some of the most actively studied devices amongst the photovoltaic (PV) community due to their potential for fabricating lightweight and large-area flexible PV devices by low-cost, roll-to-roll compatible deposition techniques. The adoption of a bulk-heterojunction (BHJ) concept, where an interpenetrating blend of conjugated polymers as electron donors and fullerene derivatives as electron acceptors serves as the photoactive layer, has been the key to continuous development of this field over the past several years. However, the inherent material properties of the conjugated polymers, such as low charge carrier mobility and lack of a broad absorption in the solar spectrum with proper charge-transport properties, constitute a bottleneck to their continued development and it is quite challenging to achieve greater than 10% power conversion efficiency (PCE) from single junction based PSCs. Multilayered tandem cell architectures may be comprised of two or more complementary photoactive layers, stacked on top of each other in series and separated by a thin interconnecting layer (IL), and may utilize a wider range of the solar spectrum for photon absorption and provide a viable route to increase the overall PCEs. Typical tandem PSC devices are made from double-junction cells and may comprise a wide band-gap material as a front cell for high energy photon absorption, an interconnecting layer in the middle for charge recombination, and a smaller band-gap material in the back for low energy photon absorption. The entire device may be sandwiched between two electrodes to complete the circuit. Typically, the open circuit voltage ($V_{oc}$) in such systems equals the sum of those of the individual subcells, thus enhancing the overall PCE, while the total current density is limited by the subcell with lower current density. The tandem architecture may offer an opportunity for overcoming efficiency limits that create a barrier towards commercialization of PSCs.

Additionally, the low cost, solution-processed, high-throughput production of PSCs requires the development of a technology that is unlimited by materials supply. In this respect, isoindigo-based conjugated polymers are attractive due to their simple, high yield and scalable synthetic routes, as well as the natural occurrence of their fundamental building units. The strong electron-withdrawing nature of the isoindigo (acceptor) moiety coupled with different electron rich (donor) units in repeating donor-acceptor type polymeric structures has led to the development of a variety of low-band-gap polymers with promising PV properties. PSCs based on this class of polymeric materials have achieved PCEs close to 6% in single junction cells, with their absorption spectra extending to the near infrared (NIR) region. The photoresponse may be further broadened by integrating complementary wide band-gap polymers into tandem architectures. The isoindigo-based polymers may enable low-cost, high-throughput PSC production capability due to their high yield synthesis, scalability, and low band-gap properties.

Besides an abundant supply of photoactive material, series-connected monolithic integration of two or more subcells in a tandem configuration requires an IL (interconnecting layer) that joins the vertically-stacked single-junction subcells. Ideally, an efficient IL must have the proper band alignment with those of the donor and acceptor molecules in the active layers, high optical transparency, low electrical resistivity, easy processability, and good chemical and mechanical stability. It is difficult to satisfy all of these desired properties with a single material. Typically, an IL consists of a combination of non-absorbing electron and hole transport layers in contact with two separate subcells, and serves as a charge recombination zone for electrons from one cell and holes from the other. A major challenge faced during the integration of ILs with solution processed photoactive components is the difficulty in controlling the process such that the underlying layers are not destroyed upon further processing. Thus, the physical and chemical robustness of the IL is of great importance in tandem solar cell fabrication.

What is desired is an interconnecting layer that utilizes commonly-available materials, is chemically and mechanically robust, and which is able to be integrated into a tandem solar cell without damaging the other layers of the solar cell.

SUMMARY OF THE INVENTION

The present invention overcomes the foregoing problems and other shortcomings, drawbacks, and challenges of efficient solar cell manufacturing. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention a method for making a tandem solar cell, comprises a) providing a substrate layer; b) applying a front layer of PCDTBT:$PC_{71}BM$ to the substrate layer; c) applying an interconnecting bilayer of chromium and $MoO_3$ to the PCDTBT:$PC_{71}BM$ layer; d) applying a back layer of P(T3-iI)-2:$PC_{71}BM$ on the bilayer of chromium and $MoO_3$; and e) applying an electrode layer on the top. This embodiment provides the advantage of an interconnecting layer that allows the electrons from the front subcell (PCDTBT:$PC_{71}BM$) to combine with the holes from the back subcell (P(T3-iI)-2:$PC_{71}BM$) at the Cr/$MoO_3$ interface, and the Cr/$MoO_3$ interface is chemically inert with regard to those chemicals utilized in the manufacture of the solar cells so that the other layers of the solar cell are not damaged, and the interconnecting layer is over 80% transparent to light in the range of 400-1000 nm, minimizing optical losses.

According to another embodiment of the invention, the substrate is a PEDOT:PSS coated ITO glass substrate. This embodiment provides the advantage of selective collection of charge carriers i.e. holes at the substrate interface.

According to another embodiment of the invention, the layer of PCDTBT:$PC_{71}BM$ is about 80-130 nm thick, e.g. about 80 nm thick. This embodiment provides the advantage of an active layer that is optimized with regard to form factor (FF), short-circuit current density ($J_{sc}$), and open circuit voltage ($V_{oc}$) considerations.

According to a further embodiment of the invention, the bilayer of chromium and $MoO_3$ comprises thermally evaporated chromium. This embodiment provides the advantage of an interconnecting layer that allows the electrons from the front subcell (PCDTBT:$PC_{71}BM$) to combine with the holes from the back subcell (P(T3-iI)-2:$PC_{71}BM$) at the Cr/$MoO_3$ interface, and the Cr/$MoO_3$ interface is chemically inert with regard to those chemicals utilized in the manufacture of the solar cells so that the other layers of the solar cell are not damaged, and the interconnecting layer is over 80% transparent to light in the range of 400-1000 nm, minimizing optical losses.

According to another embodiment of the invention, the bilayer of chromium and $MoO_3$ comprises a layer of chromium about 1-3 nm thick. This embodiment provides the advantage of an interconnecting layer that allows the electrons from the front subcell (PCDTBT:$PC_{71}BM$) to combine with the holes from the back subcell (P(T3-iI)-2:$PC_{71}BM$) at the Cr/$MoO_3$ interface, and the Cr/$MoO_3$ interface is chemically inert with regard to those chemicals utilized in the manufacture of the solar cells so that the other layers of the solar cell are not damaged, and the interconnecting layer is over 80% transparent to light in the range of 400-1000 nm, minimizing optical losses.

According to a further embodiment of the invention, the bilayer of chromium and $MoO_3$ comprises a layer of chromium about 2 nm thick. This embodiment provides the advantage of an interconnecting layer that allows the electrons from the front subcell (PCDTBT:$PC_{71}BM$) to combine with the holes from the back subcell (P(T3-iI)-2:$PC_{71}BM$) at the Cr/$MoO_3$ interface, and the Cr/$MoO_3$ interface is chemically inert with regard to those chemicals utilized in the manufacture of the solar cells so that the other layers of the solar cell are not damaged, and the interconnecting layer is over 80% transparent to light in the range of 400-1000 nm, minimizing optical losses.

According to another embodiment of the invention, the bilayer of chromium and $MoO_3$ comprises a layer of thermally evaporated $MoO_3$ about 5-15 nm thick. This embodiment provides the advantage of an interconnecting layer that allows the electrons from the front subcell (PCDTBT:$PC_{71}BM$) to combine with the holes from the back subcell (P(T3-iI)-2:$PC_{71}BM$) at the Cr/$MoO_3$ interface, and the Cr/$MoO_3$ interface is chemically inert with regard to those chemicals utilized in the manufacture of the solar cells so that the other layers of the solar cell are not damaged, and the interconnecting layer is over 80% transparent to light in the range of 400-1000 nm, minimizing optical losses.

According to a further embodiment of the invention, the bilayer of chromium and $MoO_3$ comprises a layer of $MoO_3$ about 12 nm thick. This embodiment provides the advantage of an interconnecting layer that allows the electrons from the front subcell (PCDTBT:$PC_{71}BM$) to combine with the holes from the back subcell (P(T3-iI)-2:$PC_{71}BM$) at the Cr/$MoO_3$ interface, and the Cr/$MoO_3$ interface is chemically inert with regard to those chemicals utilized in the manufacture of the solar cells so that the other layers of the solar cell are not damaged, and the interconnecting layer is over 80% transparent to light in the range of 400-1000 nm, minimizing optical losses.

According to another embodiment of the invention, the layer of P(T3-iI)-2:$PC_{71}BM$ is about 70-130 nm thick, e.g. about 100 nm thick. This embodiment provides the advantage of an active layer that is optimized with regard to form factor (FF), short-circuit current density ($J_{sc}$), and open circuit voltage ($V_{oc}$) considerations.

According to another embodiment of the invention, the tandem solar cell further comprises applying a top electrode of Ca/Al over the P(T3-iI)-2:$PC_{71}BM$ layer. The layer of calcium (Ca) may be about 2 nm thick, and the layer of aluminum (Al) on top of the Ca layer may be about 100 nm thick. This embodiment provides the advantage of selective collection of charge carriers i.e. electrons at the top electrode.

According to a further embodiment of the invention, a tandem solar cell comprising a front subcell; a back subcell; and an interconnecting layer of Cr/$MoO_3$ between the back subcell and the front subcell and connecting the two subcells in series. This embodiment provides the advantage of an interconnecting layer that allows the electrons from the front subcell, e.g. PCDTBT:$PC_{71}BM$, to combine with the holes from the back subcell, e.g. P(T3-iI)-2:$PC_{71}BM$ at the Cr/$MoO_3$ interface, and the Cr/$MoO_3$ interface is chemically inert with regard to those chemicals utilized in the manufacture of the solar cells so that the other layers of the solar cell are not damaged, and the interconnecting layer is over 80% transparent to light in the range of 400-1000 nm, minimizing optical losses.

According to another embodiment of the invention, the front subcell comprises a carbazole-thienyl-benzothiadiazole based polymer. This embodiment provides the advantage of higher adsorption of high energy photons.

According to a further embodiment of the invention, the back subcell comprises an isoindigo-based polymer. This embodiment provides the advantage of simple, high yield and scalable synthetic routes for the isoindigo compounds, as well as the natural occurrence of their fundamental building units. Isoindigo-based polymers may enable low-cost, high-throughput PSC production capability due to their high yield synthesis, scalability, and low band-gap properties. This embodiment also adds the advantage of higher adsorption of low energy photons.

According to another embodiment of the invention, the front subcell comprises a carbazole-thienyl-benzothiadiazole based polymer and the back subcell comprises an isoindigo-based polymer. This embodiment provides the advantage of a broader range of photon capture in the solar spectrum.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIGS. 1A-1B illustrate molecular structures the donor organic polymers, P(T3-iI)-2 and PCDTBT (FIG. 1A), and acceptor $PC_{71}BM$ molecules (FIG. 1B) of the disclosed invention;

FIG. 1C depicts UV-visible-near infrared absorption spectra of the donor organic polymers, P(T3-iI)-2 and PCDTBT (FIG. 1A), and acceptor $PC_{71}BM$ molecules of FIG. 1B;

FIG. 3A illustrates the UV-Vis NIR absorption spectra of an 80 nm PCDTBT:$PC_{71}BM$ BHJ composite film, a 100 nm P(T3-iI)-2:$PC_{71}BM$ BHJ composite film, and a bilayer of the two with 2 nm Cr/12 nm $MoO_3$ in between;

(FIG. 6A) 80 nm PCDTBT:$PC_{71}BM$; (FIG. 6B) 80 nm PCDTBT:$PC_{71}BM$/2 nm Cr/12 nm $MoO_3$ and (FIG. 6C) 80 nm PCDTBT:$PC_{71}BM$/2 nm Cr/12 nm $MoO_3$/100 nm P(T3-iI)-2:$PC_{71}BM$.

Figure 2B:
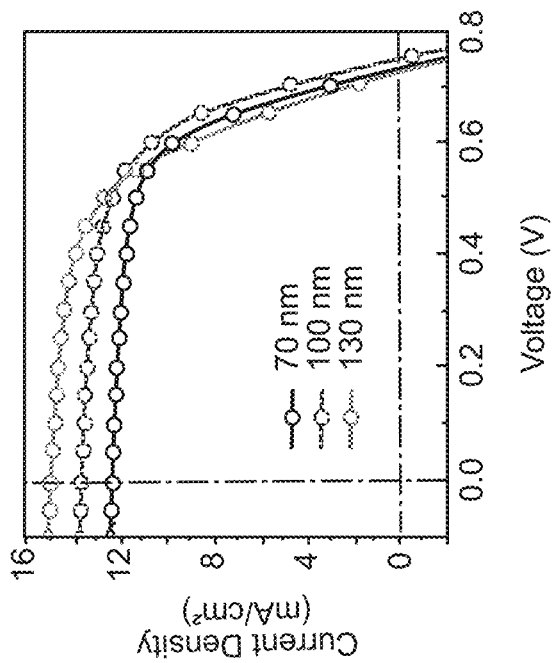
FIGS. 2A-2B illustrate a single-junction device structure and J-V curves of P(T3-iI)-2:$PC_{71}BM$ solar cells having different active layer thicknesses.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

In this work, we have developed a new, chemically robust tandem cell IL comprised of a thermally evaporated Cr and $MoO_3$ bilayer, and we show the utility of this layer through the fabrication of monolithic tandem solar cells from an easily accessible, isoindigo-based low band-gap polymer. A tandem device structure consisting of Glass/ITO/PEDOT:PSS/PCDTBT:$PC_{71}BM$/Cr/$MoO_3$/P(T3-iI)-2:$PC_{71}BM$/Ca/Al is fabricated and demonstrates successful series connection of subcells with cumulative $V_{oc}$. The PCEs of these isoindigo-based polymer tandem devices reached up to 6%, suggesting great promise towards low-cost polymer PV. Cr/$MoO_3$ is disclosed herein as a new composite interlayer for tandem PSCs composed of a low band-gap polymer which can be synthesized in kilogram quantities. Further efficiency gains may be achieved through optimization of polymer layer thicknesses to match the current densities of each photoactive layer and thereby minimize losses due to electron-hole recombination.

FIG. 1A illustrates the chemical structure of an isoindigo-based low band-gap ($E_g$=1.6 eV) polymer, P(T3-iI)-2 which may be synthesized in kilogram quantities, greatly improving efficiencies in manufacturing. Its broad absorption spectra, up to 800 nm, high extinction coefficient (~$1.2×10^5$ $cm^{-1}$ in 550-700 nm region), favorable energy levels, and high solubility in organic solvents are advantageous for construction of BHJ PV devices. Optimized single junction solar cells may be made from a 1:2 weight ratio of [P(T3-iI)-2:$PC_{71}BM$] (illustrated in FIGS. 1A-1B) active layer deposited from chloroform with 2 to 3 vol. % of 1,8-diiodooctane (DIO). More specifically, the P(T3-iI)-2:$PC_{71}BM$ (1:2 weight ratio) blend was dissolved in chloroform at 70° C. for 12 hours with 6-10 mg/mL concentration and 2 volume % of DIO was added to it. Then the blend was deposited on a substrate using a three step spin-coating at 300 rpm for 1 s, then at 500 rpm for 1 s and finally at 800 rpm for 60 s. Thereafter, all samples were dried in a glove box evacuation ante-chamber for about 2 hours.

Solid lines in FIG. 1C represent thin film samples, while dotted lines are from samples in $CHCl_3$ (chloroform) solution. A small red shift in the absorption spectra, moving from solution to film, may be related to polymer aggregation.

A single-layer device structure (FIG. 2A) of glass/ITO/PEDOT:PSS (40 nm)/Active layer/Ca (2 nm)/Al (100 nm) may be used to make single active layer control devices, and the device performance shows a strong dependence on the active layer thicknesses. A thin poly(3,4-ethylenedioxythiophene):poly(styrenesulfonate) (PEDOT:PSS) layer (≈40 nm) may be used as a hole conductor, and calcium (Ca) may be used as an electron-buffer layer. The addition of 2 vol. % DIO processing solvent additive in the blend significantly improved the morphology of the active layer and consistently enhanced the PV device performance.

Figure 2A:
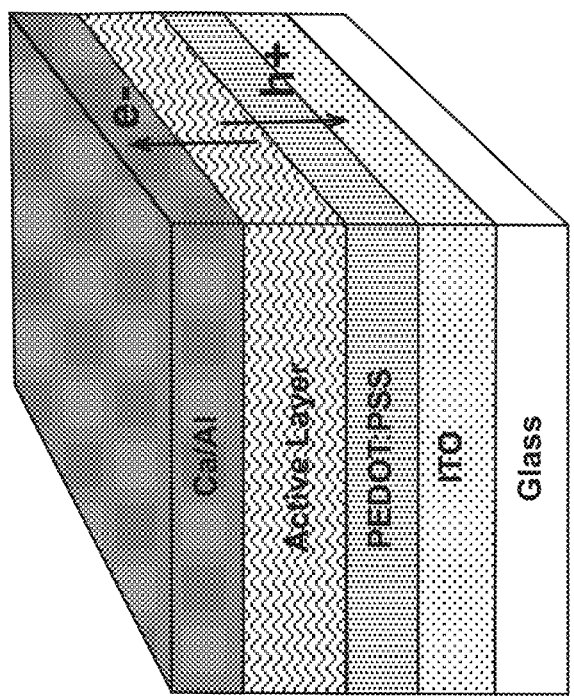
Figure 3A:
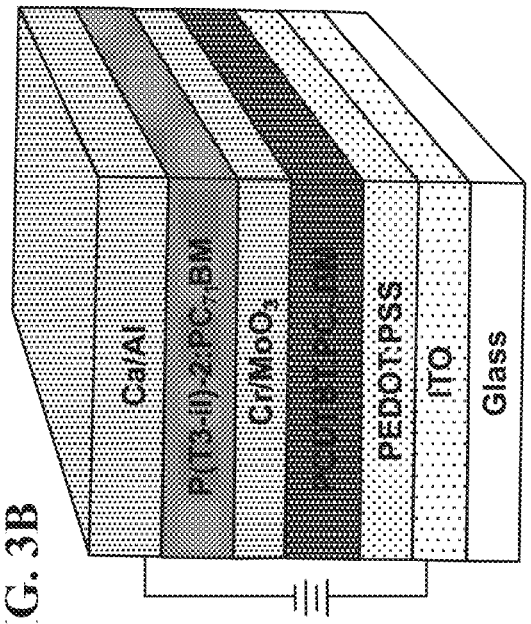

The average PCE of the optimized P(T3-iI)-2:$PC_{71}BM$ solar cell device reaches about 6.1% with a short-circuit current density (JO of 14.0±0.4 $mAcm^{-2}$, a $V_{oc}$ of 0.72±0.02 V, and a fill factor (FF) of 61±4%, when the thickness of the active layer is about 100 nm (see Table 1 below). Increasing the thickness of the active layer further to 130 nm results in a drop in FF and an improvement in $J_{sc}$, while $V_{oc}$ remains almost similar. On the other hand, for a slightly thinner active layer, about 70 nm, $J_{sc}$ decreases and FF slightly increases due to reduced light absorption and low charge recombination. In this case, the decreased $J_{sc}$ significantly outweighs the slight increase in FF and a concomitant loss in average PCE to 5.4% is observed. FIG. 2B illustrates the current density-voltage (J-V) characteristics of the highest efficiency single junction P(T3-iI)-2:$PC_{71}BM$ solar cells with various thicknesses (i.e., from 70 to 130 nm). The ultraviolet-visible (UV-Vis) spectrum of the 100 nm thick P(T3-iI)-2:$PC_{71}BM$ film (see FIG. 3A) depicts non-uniform spectral response across its absorption range. Further enhancement in the light absorption, therefore, is highly desirable.

It was determined that the integration of such a low band-gap polymer with a wider band-gap polymeric material into a tandem structure may provide a way to improve the photo response of the solar cell. However, an efficient, transparent recombination layer had to be developed to facilitate integration. Poly [N-9'-heptadecanyl-2,7-carbazole-alt-5,5-(4',7'-di-2-thienyl-2', 1', 3'-benzothiadiazole)] (PCDTBT) (FIG. 1A), which is an efficient and stable wide band-gap conjugated polymer, was chosen as a visible absorber (FIG. 1C) to enhance the solar absorption of the P(T3-iI)-2:PC$_{71}$BM PV device. Optimized single junction solar cells, made from a 1:2 weight ratio of in-house synthesized PCDTBT with PC$_{71}$BM in chloroform, have a thickness of 80 nm, with the best device efficiency reaching 5.2% under Air Mass 1.5 Global (AM1.5G) illumination (100 mW/cm$^2$) from a calibrated solar simulator. The UV-Vis absorption spectrum of the 80 nm thick film of PCDTBT:PC$_{71}$BM (FIG. 3A) shows slightly higher absorption in the 500-600 nm spectral range than that of a 100 nm thick optimized P(T3-iI)-2:PC$_{71}$BM film. The absorption spectrum of a bilayer film of 100 nm P(T3-iI)-2:PC$_{71}$BM and 80 nm PCDTBT:PC$_{71}$BM also shows a simple superposition of those of the two individual composites. Thus, the construction of tandem cells with these two BHJ material combinations may be advantageous, depending in the interconnecting layer (IL).

TABLE 1

Average[a] device characteristics of the P(T3-iI)-2:PC$_{71}$BM based single-junction solar cells with different active layer thicknesses.

| Thickness (nm) | Voc (V) | Jsc (mA/cm$^2$) | Jsc. EQE[b] (mA/cm$^2$) | FF (%) | PCE (%) |
|---|---|---|---|---|---|
| 70 | 0.72 +/− 0.01 (0.73) | 11.9 +/− 0.4 (12.3) | (10.9) | 63 +/− 3 (66) | 5.4 +/− 0.5 (5.9) |
| 100 | 0.72 +/− 0.02 (0.74) | 14.0 +/− 0.4 (13.6) | (12.8) | 61 +/− 4 (65) | 6.1 +/− 0.4 (6.5) |
| 130 | 0.71 +/− 0.01 (0.72) | 14.4 +/− 0.6 (15.0) | (13.6) | 56 +/− 3 (59) | 5.7 +/− 0.7 (6.4) |

[a]Averages taken for at least 20 devices.
[b]Jsc measured on each of the best performing devices by integrating EQE data; values in parenthesis are for the best performing devices.

Figure 4:
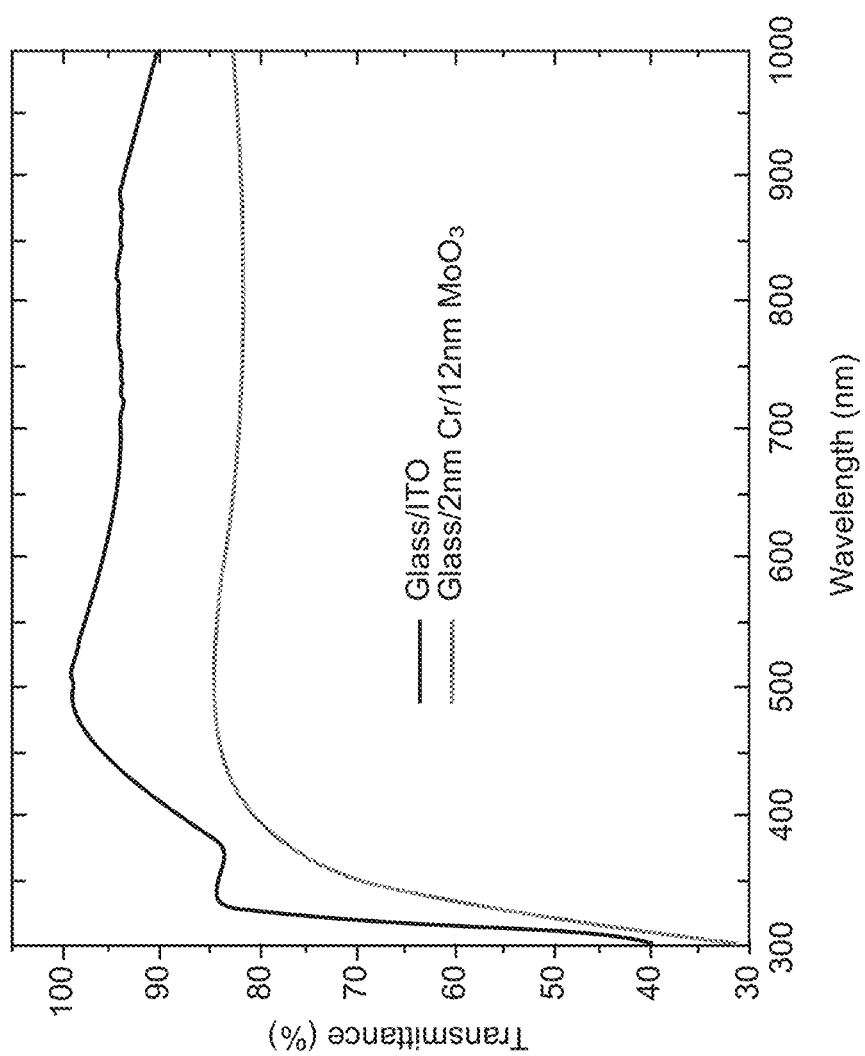
FIG. 4 illustrates the transmission spectra of ITO on a glass substrate and 2 nm Cr/12 nm $MoO_3$ film deposited on glass.

In order to build efficient polymer tandem solar cells based on P(T3-iI)-2 materials, proper choice of the IL is important. The combination of ZnO nanoparticles as the electron transport layer and pH-neutral PEDOT:PSS as the hole transport layer did not work well likely due to the complexity of ink formulation and aqueous nature of commercial PEDOT:PSS which potentially damaged the underlayers. However, it was discovered that by depositing a thin bilayer of thermally evaporated chromium (Cr) (~2 nm) and ~12 nm MoO$_3$ yields a robust IL that gives consistently better device performance. Cr, being a relatively chemically inert element, effectively protects the underlayers from subsequent device processing. In addition to its chemical stability, this newly-developed thermally deposited Cr(~2 nm)/MoO$_3$(~12 nm) IL is highly transparent (over 80%) in the range of 400-1000 nm (see FIG. 4), ensuring minimum optical losses when light passes from one subcell to another.

Figure 3B:
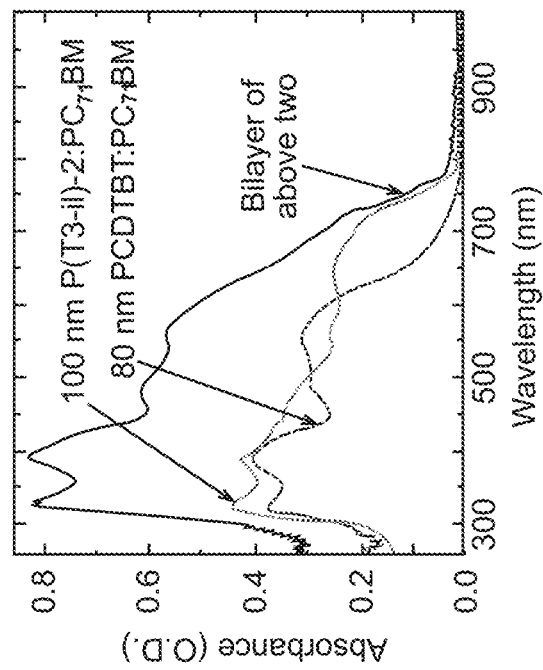
FIG. 3B depicts a tandem device structure, according to the present invention, in which a Cr/$MoO_3$ interconnecting layer is incorporated.
Figure 3C:
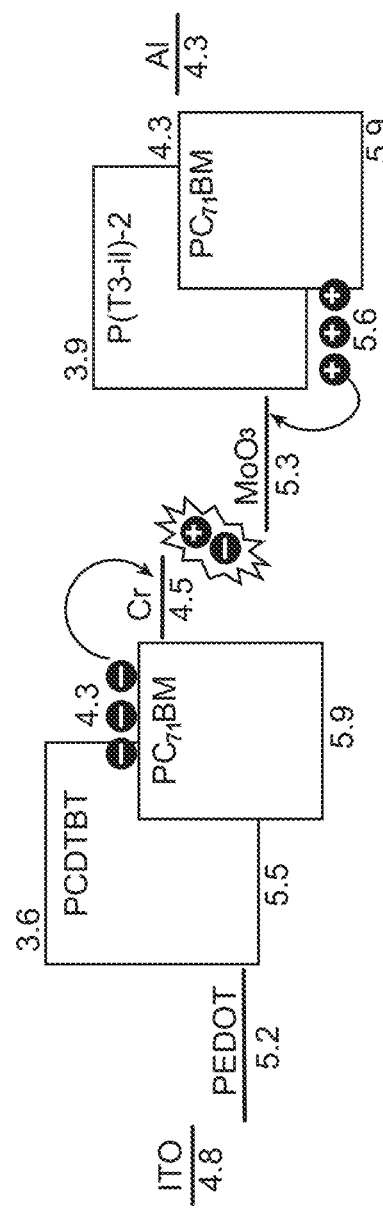
FIG. 3C depicts an energy diagram for the various layers in an optimized tandem device (values are in eV) according to the present invention.

Tandem solar cells may be built from a PCDTBT:PC$_{71}$BM front cell and a P(T3-iI)-2:PC$_{71}$BM back cell using this Cr/MoO$_3$ recombination (interconnection) layer. FIGS. 3B-3C illustrate the structure of a multilayer tandem cell, according to the present invention, together with the energy band diagram of the different layers. The work functions of Cr and MoO$_3$ are well aligned with the respective conduction band of PC$_{71}$BM and the valence band of P(T3-iI)-2. Therefore electrons from the front PCDTBT subcell combine with holes from the back P(T3-iI)-2 subcell at the Cr/MoO$_3$ interface. Since the total photocurrent from a series connected tandem cell is limited by the subcell with the lowest photocurrent, the PCDTBT wide band-gap front cell is the limiting cell in this case. An 80 nm thick PCDTBT front subcell with a high J$_{sc}$ and FF maintains sufficient transmission to the back subcell in order to achieve high performance in the disclosed tandem cell architectures. Low band-gap P(T3-iI)-2 rear cells with three different thickness, ranging from 70 to 130 nm, were studied and the details of the tandem cell device performances are summarized in Table 2.

TABLE 2

Summary of average[a] PV parameters of the optimized cells.

| Sample[b] | d (nm)[c] | Voc (V) | Jsc (mA·cm$^{-2}$) | FF % | PCE % |
|---|---|---|---|---|---|
| PCDTBT | 80 | 0.88 (0.88) | 9.9 (10.2) | 57 (58) | 5.0 (5.2) |
| P(T3-iI)-2 | 100 | 0.72 (0.74) | 14.0 (13.6) | 61 (65) | 6.1 (6.5) |
| Tandem | 80/70 | 1.48 (1.50) | 7.2 (7.5) | 47 (50) | 5.0 (5.6) |
| Tandem | 80/100 | 1.51 (1.53) | 8.3 (8.6) | 44 (46) | 5.5 (6.0) |
| Tandem | 80/130 | 1.42 (1.45) | 7.6 (8.0) | 36 (40) | 3.9 (4.6) |

[a]Values in parenthesis are for the best performing devices
[b]Blend with PC$^{71}$BM,
[c]Thickness of the active layer.

Figure 5B:
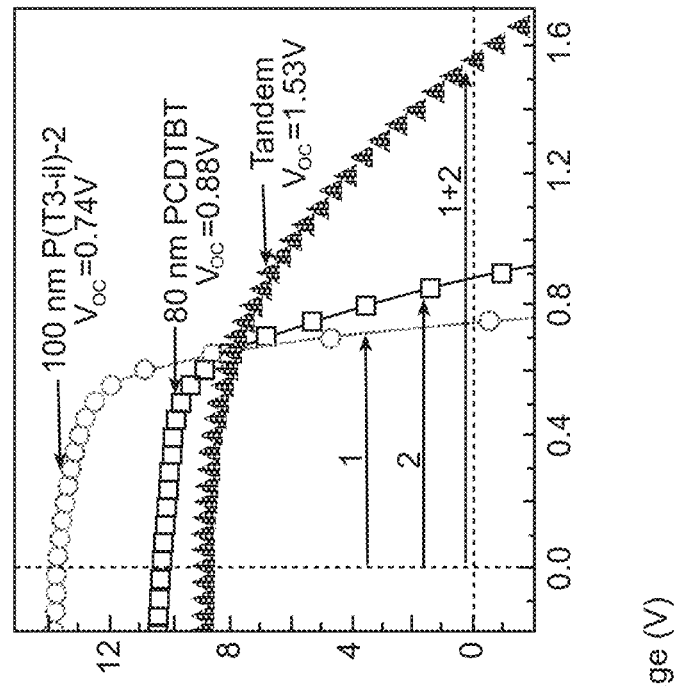
FIGS. 5A-5B illustrate J-V curves of tandem PSCs with various thicknesses of rear P(T3-iI)-2:$PC_{71}BM$ cells (FIG. 5A); and the J-V curves of the sub-cells and the optimal tandem polymer cell (FIG. 5B)
Figure 5A:
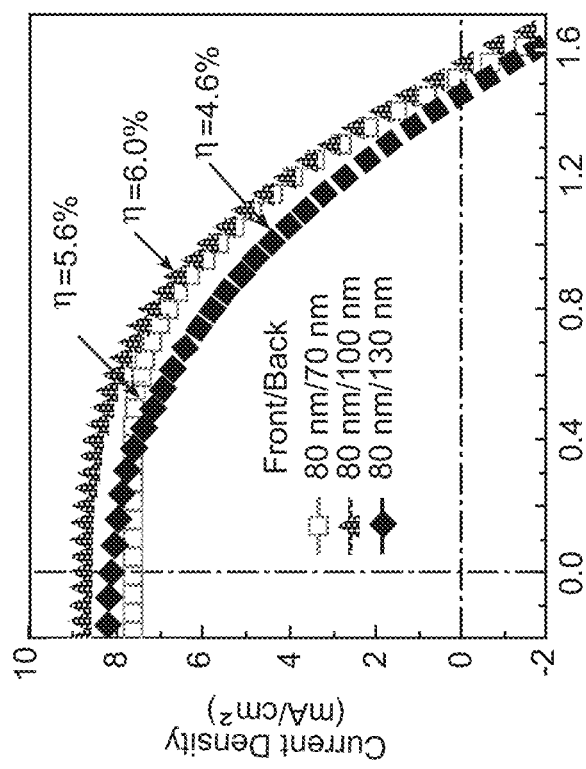
Figures 6A, 6B, 6C:
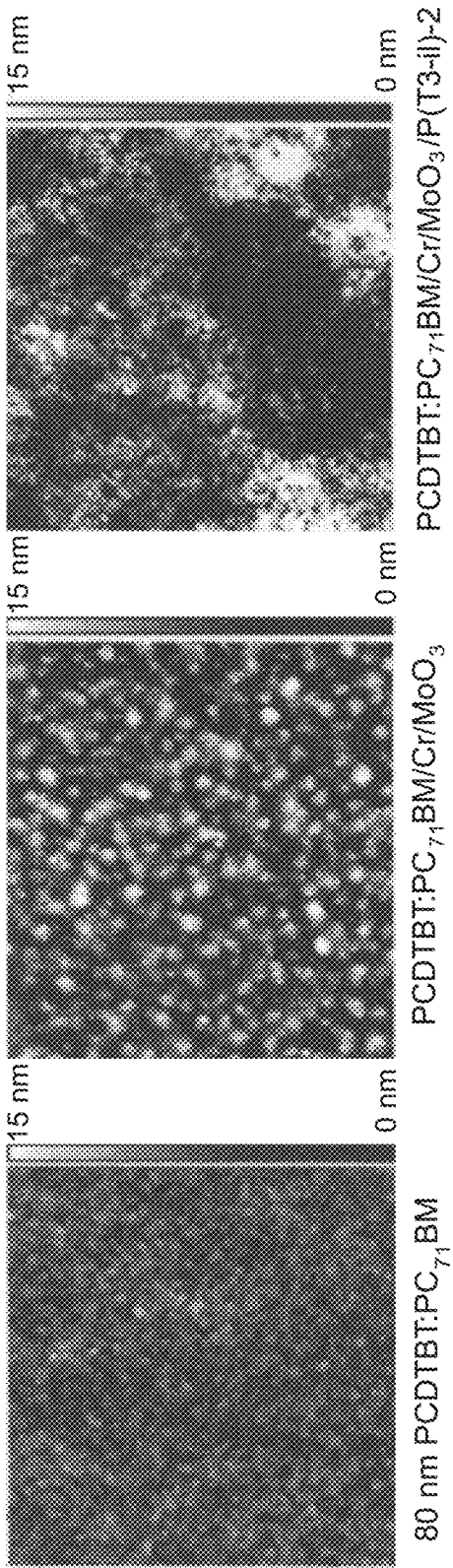
FIGS. 6A-6C depict AFM (height) images (5 μm×5 μm) of thin film surface topographies at different stages during progression of tandem cell fabrication on glass/ITO/PEDOT:PSS.

FIG. 5A illustrates the corresponding J-V curves of the tandem cells measured under simulated 100 mW/cm$^2$ solar illuminations. The tandem cell with an 80 nm front cell and a 100 nm back cell exhibited the highest performance with the best cell reaching 6.0% PCE. Atomic force microscopy (AFM) images of the thin-film surface topography at different stages of progression during the tandem cell fabrication process showed very small surface roughness values, all within 15 nm (see FIGS. 6A-6C). The J-V characteristics of the best-performing tandem cells are illustrated in FIG. 5B and compared with those of the best-performing single junction subcells of similar thicknesses. These results clearly show that the V$_{oc}$ of ≈1.53 V of the tandem device with J$_{sc}$ of 8.6 mA/cm$^2$ and FF of 46%, is approximately equal to the sum of V$_{oc}$'s of the front (0.88 V) and back (0.74 V) single junction cells, which confirms an effective series connection by the Cr/MoO$_3$ IL. With thinner (70 nm) rear cells, the J$_{sc}$ of tandem devices decrease to an average value of 7.2 mA/cm$^2$ due to low photon absorption, and increasing rear cell thickness to 130 nm reduced the FF of tandem devices due to increased charge recombination losses (see Table 2 above). In each of the tandem devices tested, very close to additive voltages are obtained which suggests a great opportunity for isoindigo-based low band-gap conjugated polymers for integration in tandem architectures.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Examples

Single Junction Device Fabrication.

All solar cell devices were fabricated on patterned ITO glass (Sheet resistance of 15Ω/□). On the day of deposition, the ITO glass substrates were cleaned sequentially by sonicating with detergent, deionized water, acetone, and isopropanol, followed by drying with high flow of nitrogen and UV-ozone treatment for 20 min. Filtered (0.45 micron PVDF filter) poly-(3,4-ethylenedioxythiophene: poly(styrenesulfonic acid) (PEDOT:PSS; Clevios A14083 from Heraeus Materials Technology) was spin-coated on clean ITO glass substrates at 3000 rpm for 60 s and then dried on a ceramic hot-plate at 160° C. for 20 min in air. Thereafter, substrates were immediately taken to a nitrogen-filled glove box for active layer deposition. For single junction PCDTBT device of different thickness, PCDTBT:PC$_{71}$BM (1:2 weight ratio; 2 volume % of DIO as processing additive) blend in chloroform was spin-coated on top of ~40 nm PEDOT:PSS at 2000 rpm for 60 s in the concentration range of 5-12 mg/mL. After spin-coating the active layer, the samples were immediately loaded with a shallow-mask into a glove-box integrated thermal evaporation chamber for Ca (~2 nm)/Al (~150 nm) deposition at a base pressure of 2×10$^{-6}$ torr. For the P(T3-iI)-2 active layer, P(T3-iI)-2:PC$_{71}$BM (1:2 weight ratio) were dissolved in chloroform at 70° C. for 12 hours with 6-10 mg/mL concentration and 2 volume % of DIO was added to it. The blend was deposited using a three step spin-coating at 300 rpm for 1 s, then at 500 rpm for 1 s and finally at 800 rpm for 60 s. Then all samples were dried in a glove box evacuation ante-chamber for about 2 hours before transferring them into a thermal evaporator for Ca/Al electrode deposition. The active area of each device is 0.1 cm$^2$, measured by the overlap of top Ca/Al electrode and ITO.

Tandem Device Fabrication.

Tandem device structure, as depicted in FIG. 3B, was built layer-by-layer on top of PEDOT:PSS coated ITO glass substrate. Active layers were deposited using the same protocol as practiced for single junction device fabrication. The major addition in the process steps is the insertion of a thermally evaporated Cr (~2 nm)/MoO$_3$ (~12 nm) interconnecting layer between two active layers. The chromium layer is thermally evaporated first, followed by the MoO$_3$ layer, which is also thermally evaporated. In order to avoid the overestimation of photocurrent density by the optical piping effect (any cross talking between two adjacent cells), device active area was defined by careful mechanical scribing by a sharp razor blade together with the use of an optical aperture.

The disclosed process may be utilized to manufacture high performance polymer tandem solar cells from an isoindigo-based low band-gap polymer which may be easily obtainable from renewable and sustainable synthetic sources. The importance of a new, chemically robust Cr/MoO$_3$ IL is also illustrated for consistent tandem cell device performance. The constructed tandem cells reached promising PCEs (5.5% average, 6.0% for a champion cell) with V$_{oc}$ of 1.51±0.02 V, approaching 94% of the sum of the single junction subcells.

One skilled in the art could readily realize the possible substitutions in materials, device architectures, fabrication tools, and processing steps that can be made without significantly detracting from the invention. For example, the present interconnecting layer can be applied to fabricate tandem devices comprising a variety of materials and their possible combinations. The substrates, interlayers, growth environments, ink formulation and the method of deposition for each individual layer in the device may be altered too. Alternative fabrication methods for photoactive layers include but not limited to thermal evaporation, ink-jet printing, aerosol-jet printing, spray coating, doctor-blading, transfer printing, etc. The interconnecting layer may be deposited by chemical/physical vapor deposition, reactive magnetron sputtering, atomic layer deposition or any solution-based approach.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method for making a tandem solar cell, comprising:
a) providing a substrate layer;
b) applying a layer of PCDTBT:PC$_{71}$BM directly to the substrate layer;
c) applying a bilayer of chromium and MoO$_3$ to the PCDTBT:PC$_{71}$BM layer;
d) applying a layer of P(T3-iI)-2:PC$_{71}$BM,
wherein P(T3-iI)-2 is a 2-thiophene-terminated polymer consisting of the following repeat unit:

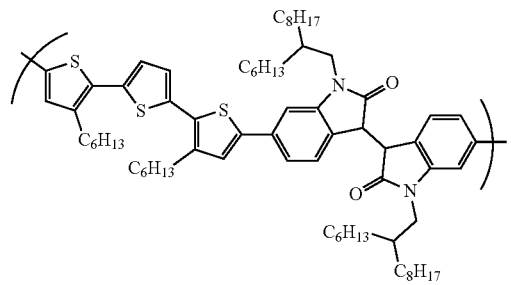

directly on the bilayer of chromium and MoO$_3$; and
e) applying an electrode layer on the top.

2. The method of making a tandem solar cell of claim 1, wherein the substrate is a PEDOT:PSS coated ITO glass substrate.

3. The method of making a tandem solar cell of claim 1, wherein the layer of PCDTBT:PC$_{71}$BM is about 80-130 nm thick.

4. The method of making a tandem solar cell of claim 1, wherein the layer of PCDTBT:PC$_{71}$BM is about 80 nm thick.

5. The method of making a tandem solar cell of claim 1, wherein the bilayer of chromium and MoO$_3$ comprises thermally evaporated chromium and MoO$_3$.

6. The method of making a tandem solar cell of claim 1, wherein the bilayer of chromium and MoO$_3$ comprises a layer of chromium about 1-3 nm thick.

7. The method of making a tandem solar cell of claim 1, wherein the bilayer of chromium and MoO$_3$ comprises a layer of chromium about 2 nm thick.

8. The method of making a tandem solar cell of claim 1, wherein the bilayer of chromium and MoO$_3$ comprises a layer of MoO$_3$ about 5-15 nm thick.

9. The method of making a tandem solar cell of claim 1, wherein the bilayer of chromium and MoO$_3$ comprises a layer of MoO$_3$ about 12 nm thick.

10. The method of making a tandem solar cell of claim 1, wherein the layer of P(T3-iI)-2:PC$_{71}$BM is about 70-130 nm thick.

11. The method of making a tandem solar cell of claim 1, wherein the layer of P(T3-iI)-2:PC$_{71}$BM is about 100 nm thick.

12. The method of making a tandem solar cell of claim 1, further comprising applying a top electrode of Ca/Al over the P(T3-iI)-2:PC$_{71}$BM layer.

* * * * *